United States Patent [19]
Chavan et al.

[11] Patent Number: 5,574,346
[45] Date of Patent: Nov. 12, 1996

[54] ON AND OFF STATE FAULT DETECTION CIRCUIT FOR A MULTI-PHASE BRUSHED OR BRUSHLESS DC MOTOR

[75] Inventors: Abhijeet V. Chavan, Ann Arbor, Mich.; David W. Stringfellow, Kokomo; Sanmukh M. Patel, Indianapolis, both of Ind.

[73] Assignee: Delco Electronics Corporation, Kokomo, Ind.

[21] Appl. No.: 441,108

[22] Filed: May 15, 1995

[51] Int. Cl.⁶ .................................................. H02H 7/26
[52] U.S. Cl. ............................. 318/434; 361/28; 361/33; 361/75
[58] Field of Search .................... 361/71, 67, 76, 361/86, 85, 92, 75, 23, 28, 29, 33; 318/434, 799, 809, 254, 439; 388/812, 813, 820

[56] References Cited

U.S. PATENT DOCUMENTS

| | | |
|---|---|---|
| 3,958,153 | 5/1976 | Narayan . |
| 4,331,995 | 5/1982 | Voss ........................................ 361/85 |
| 4,484,246 | 11/1984 | Andau ...................................... 361/71 |
| 4,896,089 | 1/1990 | Kliman et al. ........................... 318/254 |
| 4,958,948 | 9/1990 | Srema et al. ............................. 388/812 |

*Primary Examiner*—John W. Cabeca
*Attorney, Agent, or Firm*—Jimmy L. Funke

[57] ABSTRACT

A fault detection circuit monitors voltage drops associated with phase windings of a brushed or brushless reversible multi-phase motor and compares them with reference voltages to determine if the motor is out of normal operating range parameters and if a valid fault condition exists. The fault detection circuit-is included in a motor control circuit and is configurable for use with a wide variety of motors having a broad range of load characteristics. The fault detection circuit includes a programmable clock generator which generates time delays for masking faults detected during start-up and during motor phase sequencing. The fault detection circuit thereby avoids transient and spurious faults and prevents the unnecessary termination of motor operation. The length of the mask time delay required for effective fault detection operation depends on the load characteristics of the selected motor. The parameters defining the mask time delay are selected to match the time delay to the characteristics of the motor. The parameters are downloaded to the fault detection circuit from an external source.

13 Claims, 11 Drawing Sheets

ON AND OFF STATE FAULT DETECTION CIRCUIT FOR A MULTI-PHASE BRUSHED OR BRUSHLESS DC MOTOR

BACKGROUND OF THE INVENTION

The circuit of the present invention relates generally to motor control circuits and more particularly to fault detection circuits incorporated therein. It is known to utilize motor driver circuits to interface a microcomputer or other controller with motor power drive apparatus so as to control electrical motor operation. It is also known to utilize an H-bridge transistor configuration and pulse width modulation (PWM) operation in driving reversible multi-phase motors. The H-bridge transistor configuration provides a pair of series connected switching transistors which are alternatively driven to a conducting condition so as to connect each phase of the motor to the supply side of the power source or to ground for driving the motor in either of the forward or reverse directions.

In carrying out the control operations associated with sequentially connecting the phases of a motor to a power source, it is necessary to avoid damage to the switching transistors and to the multi-phase motor. Fault detection circuitry has been included in prior art motor driver interface circuits such as U.S. Pat. No. 5,111,123 (Hach et al). The circuit disclosed in Hach monitors the voltage drop across a two phase motor's phase windings to detect faulty motor operation. On the occurrence of a fault condition, the Hach circuit disables the transistor gate drive signals, and thereby prevents current flow through the motor and the switching transistors. Fault detection circuitry has also been provided in motor driver interface circuits to provide "off" mode fault detection when the transistor gates have been deactivated. One of the shortcomings associated with many prior art fault detection circuits is that they only function in brushed DC motor applications.

To avoid start-up transient and spurious fault indication, it is necessary to provide a fault detection circuit with a mask time delay feature. This time delay feature prevents the fault detection circuit from acknowledging a fault condition until a predetermined number of clock pulses, which represent a corresponding calculated period of time, have been counted. The necessary time delay period is dependent upon the particular load characteristics of the motor to be controlled. A major shortcoming of prior art fault detection circuits is their inability to adjust the duration of the mask time delay period. Accordingly, prior art fault detection circuit configurations, once selected, only function for a certain fixed range of loads. Therefore, such circuits can only be used with certain motors.

What is needed is a fault detection circuit for use in motor control apparatus which functions in either brushed or brushless motor applications.

A fault detection circuit is also needed that can provide a programmably adjustable fault mask time delay for allowing the same circuit to be used with a wide range of motors.

SUMMARY OF THE INVENTION

The fault detection apparatus of the present invention is directed at providing a fault detection circuit which is adaptable for use with either brushed or brushless DC motor applications. Moreover, the circuit will function with a wide range of motors having divergent load characteristics and when being controlled in either the ON or OFF mode.

When in the ON mode, the fault detection circuit selectively monitors the voltage drop across the phase windings of a multi-phase motor. The circuit selects the phases to be monitored in accordance with the gate drive control sequence used in driving the motor to a desired position. The voltage drop across a phase winding is compared with a reference voltage. When a phase winding is stuck to battery or stuck to ground, i.e. when the winding insulation has been removed and a winding touches the grounded chassis of a vehicle, the sensed voltage drop across the phase winding is outside the normal operating range as compared to a respective reference voltage. This is perceived as a fault condition by the fault detection circuit.

In order to avoid start-up transient or spurious fault conditions, a mask time delay sequence is provided. At the beginning of any gate drive signal transition, a counter counts a series of prescaled clock pulses so as to provide a time delay period to mask any erroneous fault conditions sensed. Due to varying motor load characteristics, different time delay periods are required for different motors. Accordingly, the time delay period, via the corresponding number of prescaled clock pulses to be counted, is selected to match the particular load characteristics of the motor to be controlled. The fault detection apparatus is provided with a serial peripheral interface so that a host microprocessor may interface with the motor driver circuit and downloads programmed commands to a programmable clock generator. In this manner, the programmed commands effectively determine the duration of the mask time delay.

In the event no fault condition exists after the initial mask time delay period has run, the fault detection circuit awaits the next gate drive signal transition, and then resets the counter to count the initial mask time delay as described above. Should a fault condition exist after the initial mask time delay period has run, the counter is reset and counts an additional predetermined number of prescaled clock pulses. Should the fault condition continue to exist at the end of the second time delay period, then a valid fault condition is latched in a fault register. In addition, an internal feedback circuit pulls all gate drive signals low and thereby takes the activated switching transistors out of their conducting states so as to prevent any damage due to excessive currents.

When in the OFF mode of operation, the fault detection apparatus provides a current source at the winding of phase A. The source is sinked to ground through current sinks associated with the windings of phases B and C. Reference voltages are effectively compared with the current sourced through phase A and the current sinked through phases B and C to determine if a stuck to battery, stuck to ground, or open load condition exists. The mask time delay sequence works in the OFF mode as described in the ON mode. Should a valid fault condition exist, then the gate drive signals are held low so as to prevent the switching transistors from going to a conducting state.

An advantage of the present invention is the use of a programmable clock generator to provide an adjustable fault mask time delay, thereby allowing a motor control circuit to be implemented with a wide range of motors having divergent load characteristics.

Another advantage associated with the present invention is that it may be utilized in both brushed and brushless motor applications.

In one embodiment the invention provides a fault detection circuit having a programmable clock generator capable of receiving a master clock signal and digital program commands from a host microprocessor. The programmable clock generator manipulates the master clock signal according to the host microprocessor digital commands so as to produce a prescaled clock signal. Comparator apparatus is provided for comparing at least one reference voltage with the voltage drops associated with each phase of the multi-phase motor, and for providing at least one output indicating if a sensed voltage drop falls outside a predetermined normal operating range. Select logic receives the comparator apparatus outputs and the transistor gate drive signals, and generates at least one output. A fault detecting logic block receives the select logic output and determines if at least one of a group of fault conditions exists. The fault detecting logic is capable of generating at least one fault indication output for indicating the existence of a fault condition. A gate control logic block receives the transistor gate drive signals and a PWM enable signal indicating the beginning of a PWM cycle. The gate control logic provides a fault detection initiating signal which is reset at the beginning of each transistor gate drive signal transition. A timer receives the prescaled clock signal, sequentially counts the prescaled clock pulses, and generates a multi-bit digital value. The multi-bit digital value is sequentially incremented for each prescaled clock pulse counted and is used in the state machine as the mask time delay. The state machine receives the fault detection initiating signal from the gate control logic block, the PWM enable signal, and the fault detecting logic output. Upon receiving the fault detection initiating signal, the state machine activates the timer which masks any fault detected during a first predetermined delay period, in terms of prescaled clock pulses. In the event a fault condition exists after this initial mask time delay, then the state machine resets the timer and masks the sensed fault for a second predetermined mask time delay period. Should the fault condition still exist after the second mask time delay has run, then the state machine outputs a valid fault condition so that it can be stored in a fault register.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

Figure 1:
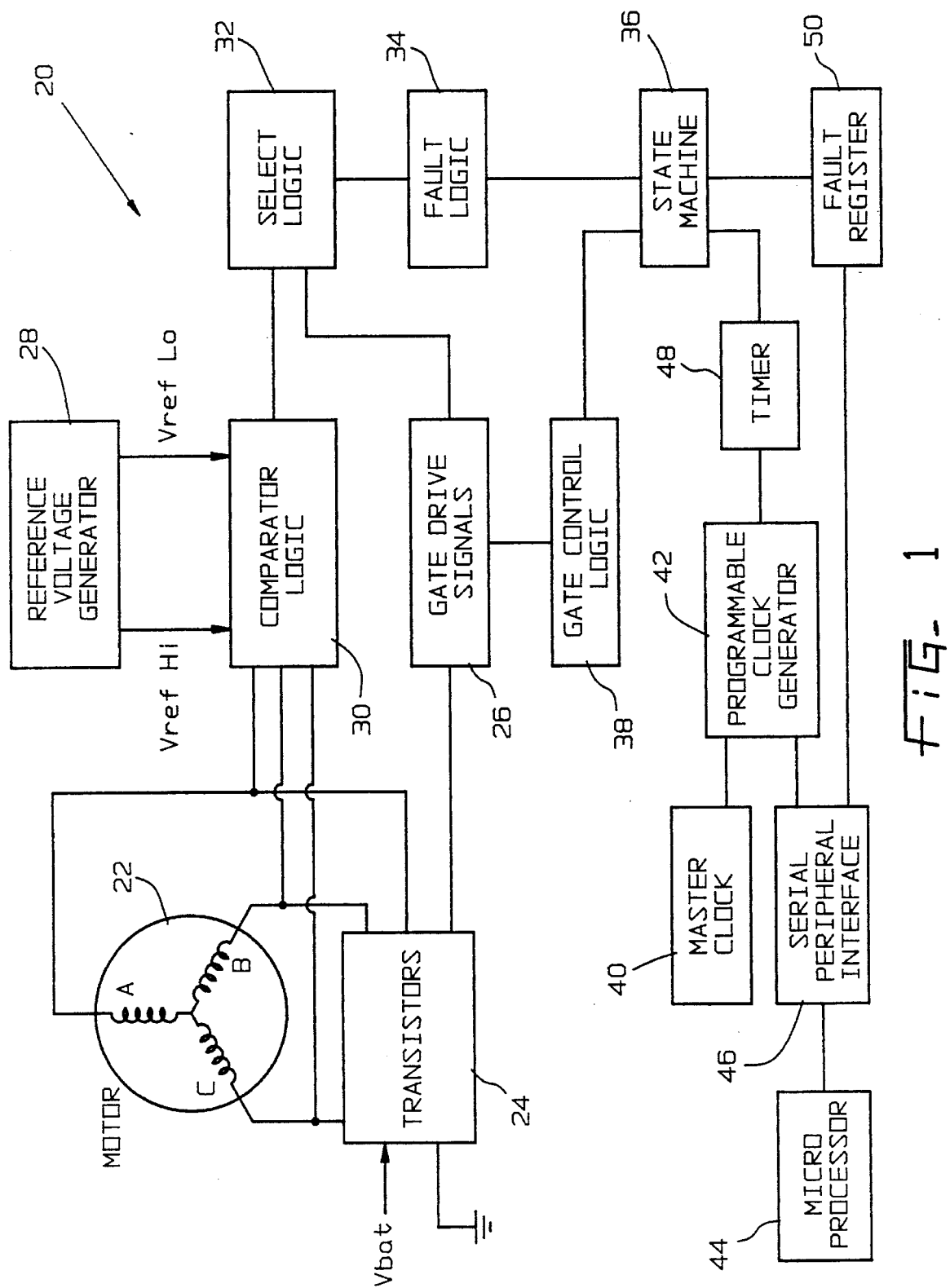
FIG. 1 is a block diagram of a fault detection circuit as utilized in a motor control circuit according to the present invention.

Corresponding reference characters indicate corresponding parts throughout the several views. The exemplification set out herein illustrate a preferred embodiment of the invention, in one form thereof, and such exemplifications are not to be construed as limiting the scope of the invention in any manner.

DETAILED DESCRIPTION OF THE INVENTION

Referring now to the drawings and particularly to FIG. 1, fault detection circuit 20 is used in a motor control circuit (not shown) to monitor the voltage drops across phases A, B and C of multi-phase motor 22 for the existence of fault conditions, such as short to ground, short to battery, or open load. Transistor block 24 receives gate drive signals 26 from the motor control circuit. Gate drive signals 26 are sequenced so as to selectively drive transistors 24 into their respective conducting conditions, thereby placing a select two of three phases A, B and C across electric supply voltage terminals $V_{bat}$ and ground. Reference voltage generator 28 can in one embodiment be a resistor divider network for receiving a voltage, such as $V_{bat}$, and producing one or more reference voltages. As used in the fault detection circuit of the present invention, reference voltage generator 28 generates four reference voltages $V_{refHI}$, $V_{refLO}$, $V_{ref1}$, and $V_{ref2}$ which are input into comparator logic block 30. The voltage drop across each of the phases A, B and C of motor 22 are compared with the reference voltages to determine if the voltage drops are outside of their normal operating range, thereby indicating a potential fault condition. This is discussed in more detail below.

The output of comparator logic block 30 is fed into select logic block 32 which also receives gate drive signals 26. Select logic block 32 determines which transistors are active and selects the appropriate out of range outputs developed by comparator logic block 30 to pass through to fault logic block 34. Fault logic block 34 develops fault condition signals which are input to state machine 36. These fault signals indicate the mode in which the motor was operating at the time the fault occurred, and whether it is a stuck to battery, stuck to ground, or open load condition. Gate control logic block 38 interprets the rising and falling edges of signals 26 to determine the beginning of each subsequent phase shifting sequence associated with rotationally driving motor 22 to a desired position. Gate control logic block 38 develops a fault detection initiating output which is input into state machine 36. A master clock signal is generated by master clock 40 and input into programmable clock generator 42. External host microprocessor 44 is connected to serial peripheral interface 46 for downloading commands to programmable clock generator 42.

In one embodiment programmable clock generator 42 may be a six bit signal divider, whereby according to a six bit digital command received from host microprocessor 44 through serial peripheral interface 46, programmable clock generator 42 develops a programmable frequency clock signal. This is accomplished by manipulating the master clock signal by dividing it by 2, 4, 8, 16, 32 or 64. The generated clock signal is then fed into timer 48 which counts each pulse of the clock signal. State machine 36, upon receiving a fault detection initiating signal, sets timer 48 to zero and initiates a fault detection mask time delay counting sequence wherein timer 48 counts a predetermined number of the prescaled clock pulses.

Initially, with the motor control circuit in either the ON or OFF mode, state machine 36 is in a default or state 0 mode and timer 48 is activated to count 16 prescaled clock pulses after which an internal end of mask signal is generated. In the event no fault condition exists at that time, the circuit remains in state 0 until being reset to repeat the sequence. Should a fault condition exist after the initial mask time delay has run, then state machine 36 transitions to state 1 and resets timer 48 to count an additional 8 prescaled clock pulses. After counting 8 clock pulses, an "end of mask" signal is generated and state machine 36 looks to the inputs received from fault logic block 34 to determine if any fault conditions still exist. Should a fault condition exist, then state machine 36 transitions to state 2.

With the fault detection circuit in state 2 and the motor control circuit in the OFF mode of operation, gate drive signals 26 remain low to prevent activation of transistors 24. Whereas in the ON mode of operation gate drive signals 26 are made low so as to deactivate transistors 24. In either instance, current is prevented from flowing through the transistors and phase windings A, B and C of motor 22, thereby preventing damage to either the transistors or the phase windings. While in state 2, state machine 36 generates a "valid fault condition" signal, which is typically input into fault register 50, and a fault output, which is typically received by microprocessor 44 as an "interrupt" condition. The fault detection sequence is repeated for each transistor switching sequence associated with driving motor 22 to a desired position. A Basic Switching Sequence Table is provided below to better demonstrate how the motor driver interface apparatus sequences phases A, B and C of motor 22 so as to rotate the motor to a desired position or in a desired manner.

Figure 2:
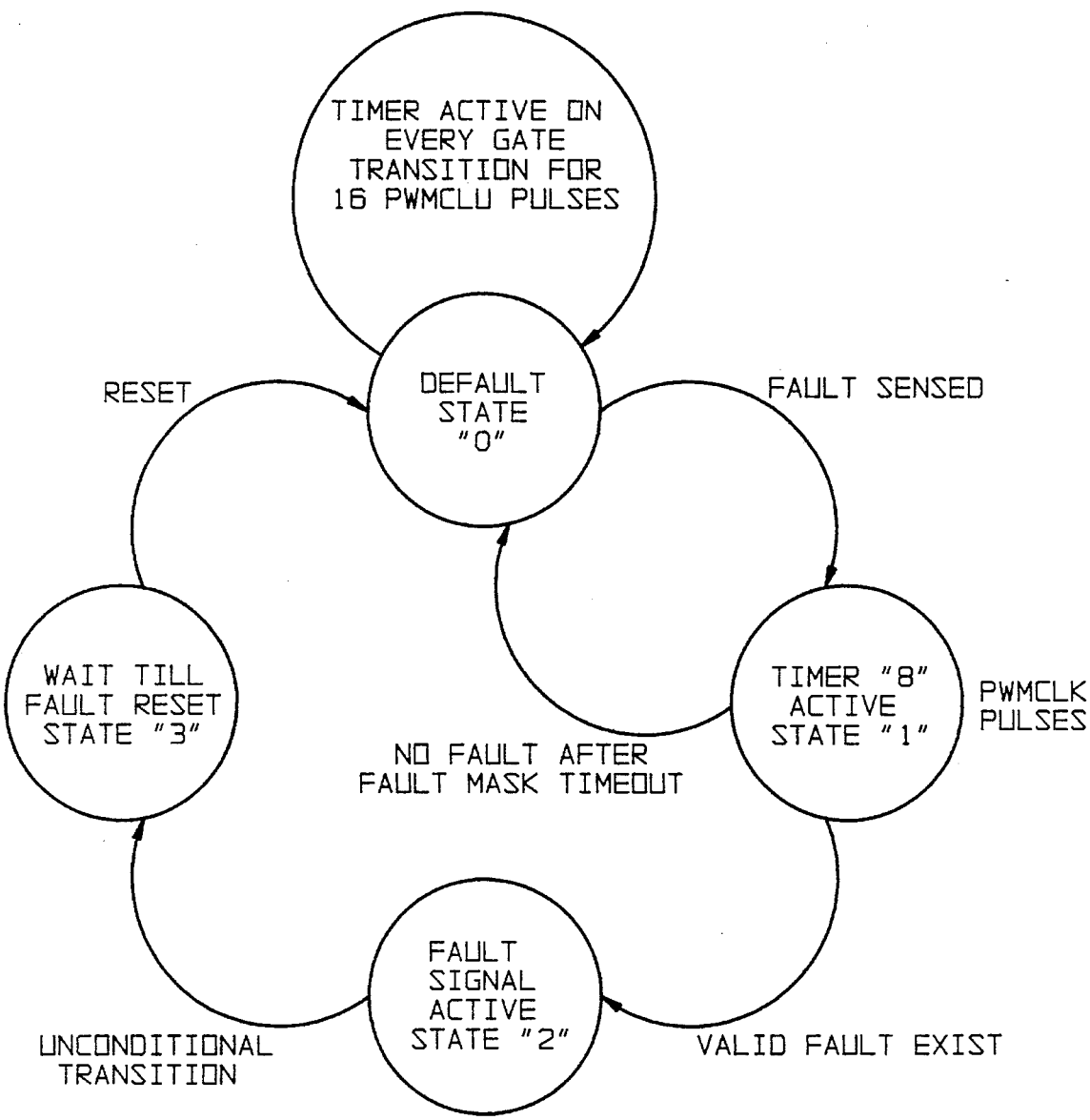
FIG. 2 is a logic diagram of a state machine for use in the fault detection circuit of FIG. 1.

FIG. 2 is a logic diagram illustrating the sequence of logic steps taken by the fault detection circuit of FIG. 1. As described above, after a gate transition, gate control logic block 38 generates a fault detection initiating signal, fault detection circuit 20 defaults to state 0, and timer 48 is activated and counts 16 clock pulses. The initial 16 clock pulses represent an initial mask time delay for masking transient faults. At the end of this initial mask time delay if no fault is detected by fault logic block 34, then fault detection circuit 20 remains in state 0 and timer 48 is reset at the next gate transition. After the initial gate transition and at each subsequent gate transition, timer 48 counts 8 clock pulses rather than 16 for the initial mask time delay.

If a fault is sensed by fault logic block 34, then the fault detection circuit transitions to state 1 and timer is reset to count an additional 8 clock pulses. This second fault mask time delay masks spurious faults so as to avoid unnecessarily terminating motor operation. At the end of this second mask time delay if the fault no longer exists, then the fault detection circuit is reset to default state 0 and after the next gate transition timer 48 is reset to count an initial mask time delay of 8 prescaled clock pulses. If the fault is still sensed at the end of the second fault mask time delay, then a valid fault condition exists, the fault detection circuit transitions to state 2, and a valid fault condition is output from state machine 36 to fault register 50. The fault detection circuit then unconditionally transitions to state 3, wherein the fault detection circuit remains until being re-initialized by the start of a new PWM cycle.

Figure 3:
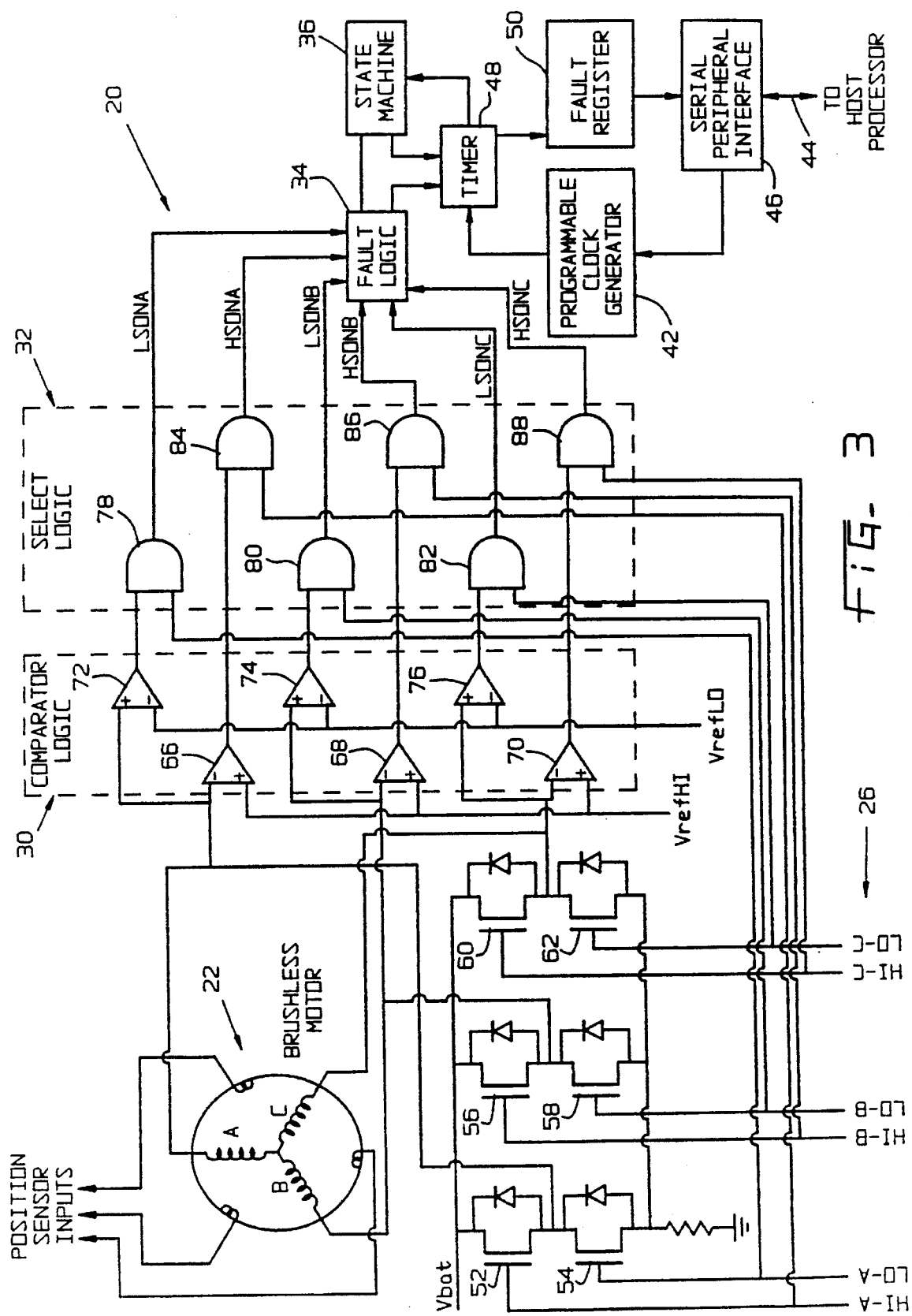
FIG. 3 is a hybrid circuit and block diagram showing components for implementing the ON state mode fault detection operation of the fault detection circuit of FIG. 1.

FIG. 3 is a hybrid circuit and block diagram of the fault detection circuit in the ON state mode of operation. Gate drive signals HI-A, LO-A, HI-B, LO-B, HI-C, and LO-C are input into the gates of respective transistors 52, 54, 56, 58, 60 and 62. Gate drive signals 26 are sequenced by the motor control circuit so as to selectively drive the transistors into their respective conducting conditions using a standard PWM technique. In this manner, the transistors sequentially connect phase windings A, B and C of motor 22 to power supply terminals $V_{bat}$ and ground so as to rotationally drive motor 22 in a desired manner.

A stuck at ground fault is detected at the node monitoring the high side transistor which is active. High side comparators 66, 68 and 70 respectively compare the voltage drops

| BASIC SWITCHING SEQUENCE TABLE | | | | | | | | | | |
|---|---|---|---|---|---|---|---|---|---|---|
| Motor Direction Signal | | Phase Sequencing Signal | | | Transistor Gate Drive Signals | | | | | |
| | | | | | High Side | | | Low Side | | |
| FWEN | RVEN | φA | φB | φC | HI-A | HI-B | HI-C | LO-A | LO-B | LO-C |
| 1 | 0 | 0 | 0 | 1 | 0 | 0 | 1 | 0 | 1 | 0 |
| 1 | 0 | 0 | 1 | 1 | 0 | 0 | 1 | 1 | 0 | 0 |
| 1 | 0 | 0 | 1 | 0 | 0 | 1 | 0 | 1 | 0 | 0 |
| 1 | 0 | 1 | 1 | 0 | 0 | 1 | 0 | 0 | 0 | 1 |
| 1 | 0 | 1 | 0 | 0 | 1 | 0 | 0 | 0 | 0 | 1 |
| 1 | 0 | 1 | 0 | 1 | 1 | 0 | 0 | 0 | 1 | 0 |
| 0 | 1 | 1 | 0 | 1 | 0 | 1 | 0 | 1 | 0 | 0 |
| 0 | 1 | 1 | 0 | 0 | 0 | 0 | 1 | 1 | 0 | 0 |
| 0 | 1 | 1 | 1 | 0 | 0 | 0 | 1 | 0 | 1 | 0 |
| 0 | 1 | 0 | 1 | 0 | 1 | 0 | 0 | 0 | 1 | 0 |
| 0 | 1 | 0 | 1 | 1 | 1 | 0 | 0 | 0 | 0 | 1 |
| 0 | 1 | 0 | 0 | 1 | 0 | 1 | 0 | 0 | 0 | 1 |
| 0 | 0 | X | X | X | 0 | 0 | 0 | 0 | 0 | 0 |
| 1 | 1 | X | X | X | DEFAULT STATE | | | DEFAULT STATE | | |
| X | X | 1 | 1 | 1 | DEFAULT STATE | | | DEFAULT STATE | | |
| X | X | 0 | 0 | 0 | DEFAULT STATE | | | DEFAULT STATE | | | associated with phase windings A, B and C with reference voltage $V_{refHI}$. If the phase is stuck at ground, then the voltage drop across the winding will result in the voltage measured being less than $V_{refHI}$. Accordingly, the high side comparator associated with the selected phase will produce a logic HI output.

A stuck at battery fault is detected at the node monitoring the low side transistor which is active. Low side comparators 72, 74 and 76 respectively compare the voltage drops associated with phase windings A, B and C with reference voltage $V_{refLO}$. If the node is stuck to battery, then the voltage will exceed $V_{refLO}$ and the associated low side comparator 72, 74 or 76 will output a logic HI signal. A shorted load condition occurs if both high and low side comparators output a logic HI simultaneously. In this case, each measured voltage will be out of its respective normal operating range.

Low side AND gates 78, 80 and 82 respectively receive the low side gate drive signals LO-A, LO-B and LO-C and the outputs from low side comparators 72, 74 and 76. AND gates 78, 80 and 82 respectively generate signal select output signals LSONA, LSONB and LSONC which are input into fault logic block 34. High side AND gates 84, 86 and 88 respectively receive the high side gate drive signals HI-A, HI-B and HI-C and the outputs from high side comparators 66, 68 and 70. AND gates 84, 86 and 88 generate select output signals HSONA, HSONB and HSONC which are input into fault logic block 34. These select signals indicate which two of the three high side and three low side comparator outputs are to be monitored for the existence of a fault condition. The interaction of the remaining fault detection circuit components is as discussed previously and as will be discussed more thoroughly below.

Figure 4:
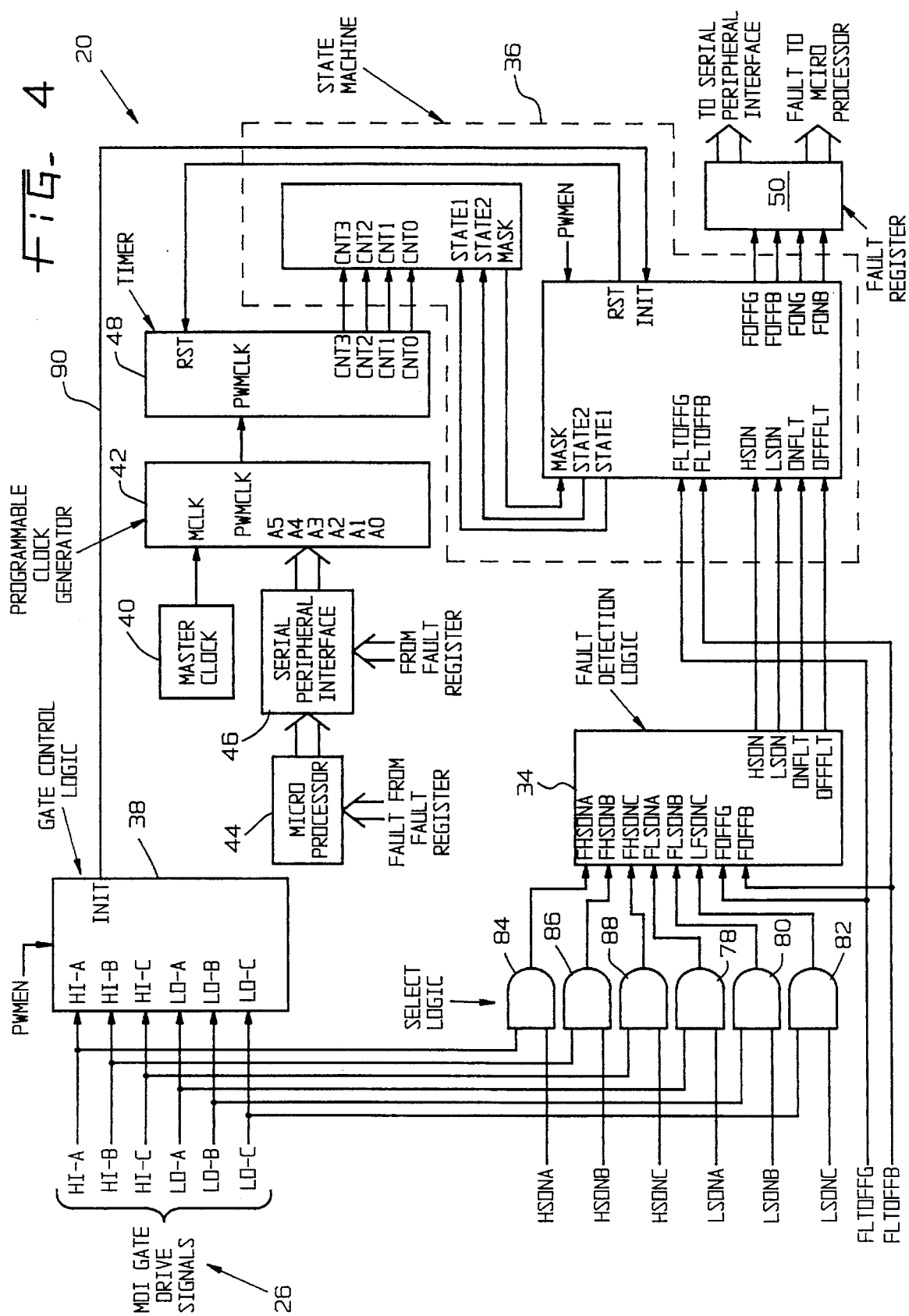
FIG. 4 is a hybrid circuit and block diagram of the fault detection circuit of FIG. 1.

FIG. 4 represents a partial schematic diagram of fault detection circuit 20, wherein motor driver interface gate drive signals HI-A, HI-B, HI-C, LO-A, LO-B and LO-C are received by gate control logic block 38 and low side AND gates 78, 80 and 82 and high side AND gates 84, 86 and 88. Gate control logic block 38 also receives PWMEN (PWM enable) signal from an external input pin. This pin is typically connected to a microprocessor output. The PWMEN signal indicates whether the motor is in the ON state or in the OFF state. Gate control logic block 38 monitors the rising and falling edges associated with gate drive signals 26 to determine the beginning of each PWM cycle. At the beginning of each gate transition, gate control logic block 38 generates a fault detection initiating signal which is input to state machine 36 along lead line 90. When a gate drive signal is active and an out of range (logic HI) signal is generated by a comparator associated with the same phase as the active gate drive signal, then a logic HI output is generated by the respective select logic AND gate and is fed into fault detection logic block 34.

For instance, when the basic switching sequence of the motor driver circuit is in the forward mode and with respective phase sequencing signal bits φA, φB and φC (which come from the position sensor outputs from the motor) having been transitioned from 1 0 0 to 1 0 1, gate drive signals HI-A and LO-B go active so as to drive high side transistor 52 and low side transistor 58 to a conducting condition. The circuit thereby drives phase A winding to $V_{bat}$ and pulls phase B winding to ground. In this situation only out of range conditions produced by comparator 66 and comparator 74 will be selected for monitoring by fault detection logic block 34 via gates 84 and 80, respectively. In the event an out of range condition exists on phase A, a resulting out of range signal is generated at output HSONA of comparator 66, which is logically ANDed with the active HI-A gate drive signal via select logic AND gate 84. Accordingly, the output of AND gate 84 will be a logic HI and will be input into fault detection logic block 34 at input FHSONA. This results in fault detection logic block 34 generating a logic HI at output HSON, a logic LO at output LSON, a logic HI at output ONFLT and a logic LO at output OFFFLT. These outputs are then input into state machine 36.

As the basic switching sequence transitions from state to state, gate control logic block 38 generates a fault detection initiating signal at output INIT which is received by state machine 36 at input INIT, thereby placing state machine 36 in default state 0. As discussed previously, programmable clock generator 42 receives a PWM master clock signal from master clock 40 and a six bit digital command (A5:A0) from host microprocessor 44 via serial peripheral interface 46. In accordance with the six bit digital command, the programmable clock generator 42 manipulates the master clock signal so as to generate a prescaled clock signal which is input into timer 48 via the output PWMCLK of clock generator 42 and the input PWMCLK of timer 48. Timer 48 counts each clock pulse from zero to 15 and outputs a four bit digital value at outputs CNT0-3. CNT0-3 are a binary representation of the number of clock pulses counted by timer 48. CNT0-3 are input into state machine 36 at inputs CNT0–CNT3 for measuring two distinct mask time delay periods.

At the beginning of the fault detection operation, timer 48 counts 16 clock pulses, after which state machine 36 internally generates an "end of mask" signal and looks at fault detection logic block outputs HSON, LSON, ONFLT, OFFFLT to determine if a fault condition exists. If no fault condition exists, then state machine 36 remains in state 0 and awaits the next fault detection initiating signal. If a fault condition exists, then state machine 36 transitions from default state 0 to state 1 and resets timer 48 via output RST as received at input RST of timer 48. Timer 48 then counts an additional 8 clock pulses as output to state machine 36 via outputs CNT0–CNT3. At the end of this second fault mask time delay, state machine 36 looks at fault detection logic block outputs HSON, LSON, ONFLT and OFFFLT to determine if the fault condition previously reported still exists. If the fault condition no longer exists, then the state machine returns to state 0 and awaits a subsequent fault detection initiating signal from gate control logic block 38.

Should the previously reported fault continue to exist, then state machine 36 transitions to state 2 and generates a valid fault indication signal and at least one of fault outputs FOFFG, FOFFB, FONG, and FONB for input into fault register 50 accessible to microprocessor 44 via serial peripheral interface 46. In accordance with the particular fault type, as indicated at inputs HSON, LSON, ONFLT, and OFFFLT, state machine 36 generates an appropriate logic HI condition at the corresponding fault output indicating a valid fault condition of a particular type. The PWMEN signal is input into state machine 36 and indicates whether the motor control circuit is in the ON state or in the OFF state. Provided below is a Fault Diagnostics Table relating the particular output configuration of outputs FOFFG, FOFFB, FONG and FONB to a particular type of fault or no fault condition.

FAULT DIAGNOSTIC REGISTER TABLE

| FOFFG | FOFFB | "OFF" State Fault Status (PWMEn = 0) |
|-------|-------|--------------------------------------|
| 0 | 0 | Normal Load |
| 0 | 1 | Short to battery |
| 1 | 0 | Short to ground |
| 1 | 1 | Open Load |

| FONG | FONB | "ON" State Fault Status (PWMEn = 1) |
|------|------|-------------------------------------|
| 0 | 0 | Normal Load |
| 0 | 1 | Short to battery |
| 1 | 0 | Short to ground |
| 1 | 1 | Shorted Load |

Figure 5:
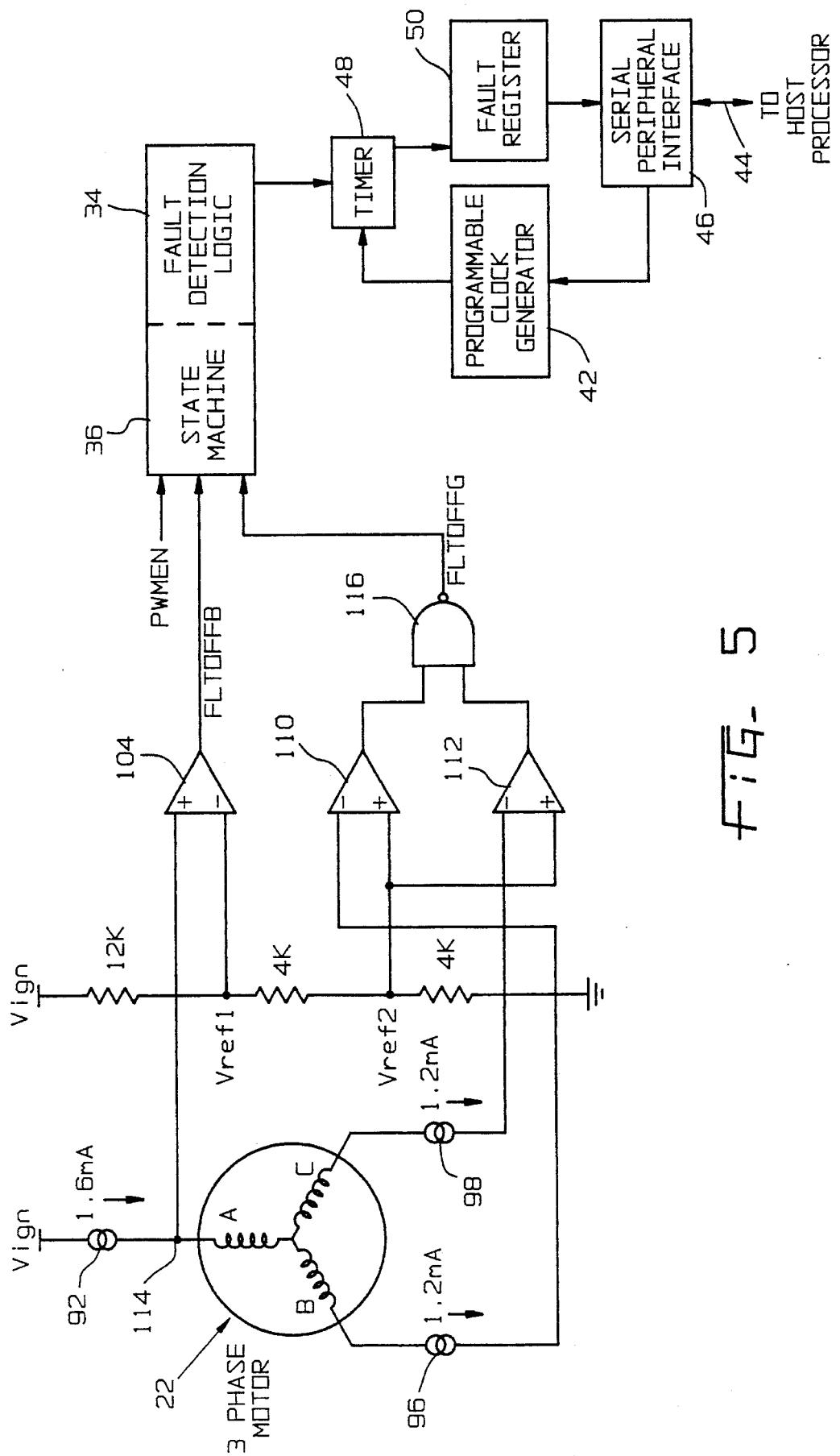
FIG. 5 is a hybrid circuit and block diagram showing components for implementing the OFF state mode fault detection operation of the fault detection circuit of FIG. 1.

FIG. 5 is a hybrid circuit and block diagram illustrating the fault detection circuit in the OFF state mode of operation. Phase winding A of three-phase motor 22 is connected to current source 92 which is connected to $V_{ign}$. Current source 92 assimilates the current that would normally flow through the motor windings when in the ON state. The current sourced through phase A is conducted through phases B and C via current sinks 96 and 98 which are connected to ground through resistors 100 and 102. Current source 92 is current limited and consists of a resistor divider or transistor circuit so as to provide a generally fixed amount of current through phase A, typically 1.6 milliamps. The current sourced through phase A is sensed as a voltage and connected to the positive input of comparator 104 where it is compared with reference voltage $V_{ref1}$. The currents conducted through phases B and C are sensed as voltages at respective nodes 106 and 108. The voltages at nodes 106 and 108 are input into the respective negative inputs of comparators 110 and 112 and are compared with reference voltage $V_{ref2}$.

If phase B or phase C is stuck to battery, then the current sourced out of phase A, as sensed at node 114, will be less than 1.6 milliamps. If phase A is stuck to battery then the current sourced out of node 114 will also be less than 1.6 milliamps. Comparator 104 monitors the current sourced through phase A as sensed at node 114 and compares it against reference voltage $V_{ref1}$ to determine if any of the phases A, B or C are stuck to battery.

If any one or more of phases A, B, or C is stuck to ground, then the current sourced out of node 114 will current limit to 3.2 milliamps and neither current sink 96 nor current sink 98 will be able to meet the threshold requirement of 1.2 milliamps sunk from phase B or phase C to ground as sensed by comparators 110 and 112 at nodes 106 and 108. Upon such an occurrence, either comparator 110 or 112 will output a logic HI signal leading OR gate 116 to output a logic HI signal input into fault detection logic block 34 and state machine 36. The remainder of the circuit operates as previously discussed.

Figure 6:
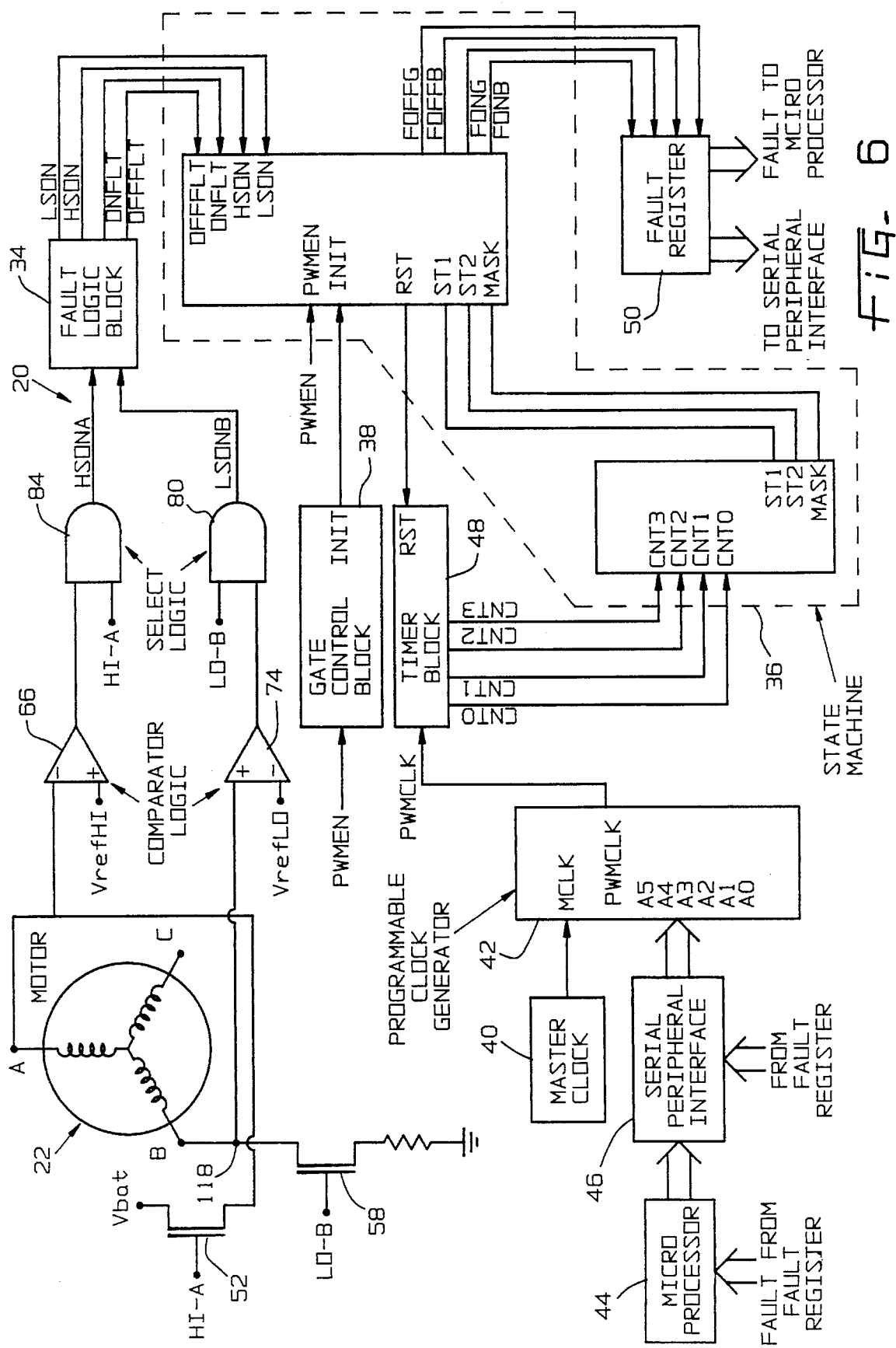
FIG. 6 is a hybrid circuit and block diagram showing components for implementing the ON state mode fault detection operation for a single sequence of the motor control operation wherein phase A is driven high to battery and phase B is pulled low to ground to cause a motor to be rotated in a desired manner.
Figure 7A:
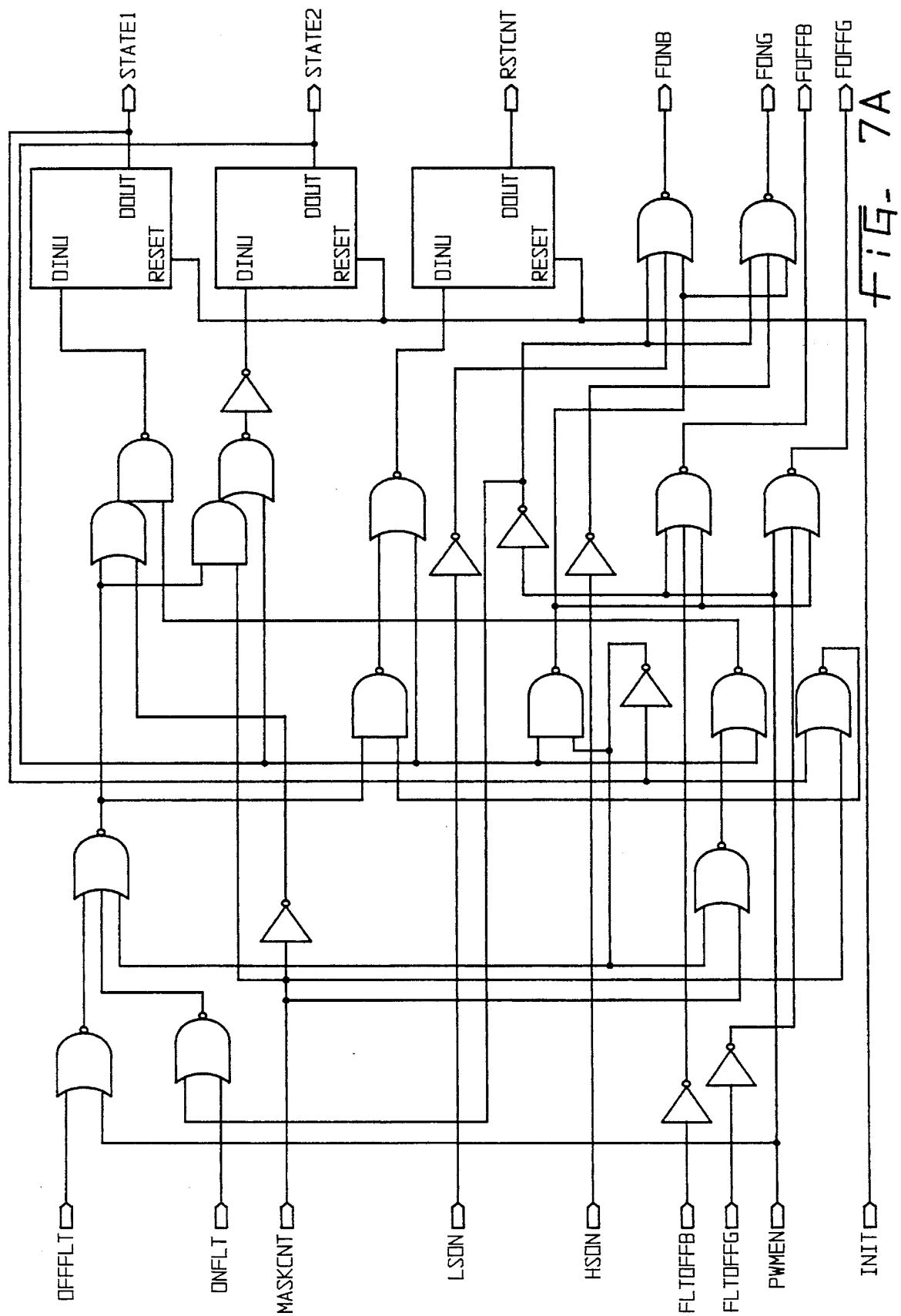
FIG. 7A is a partial circuit diagram showing the logic associated with a state machine for use in the fault 15 detection circuit of FIG. 1.
Figure 7B:
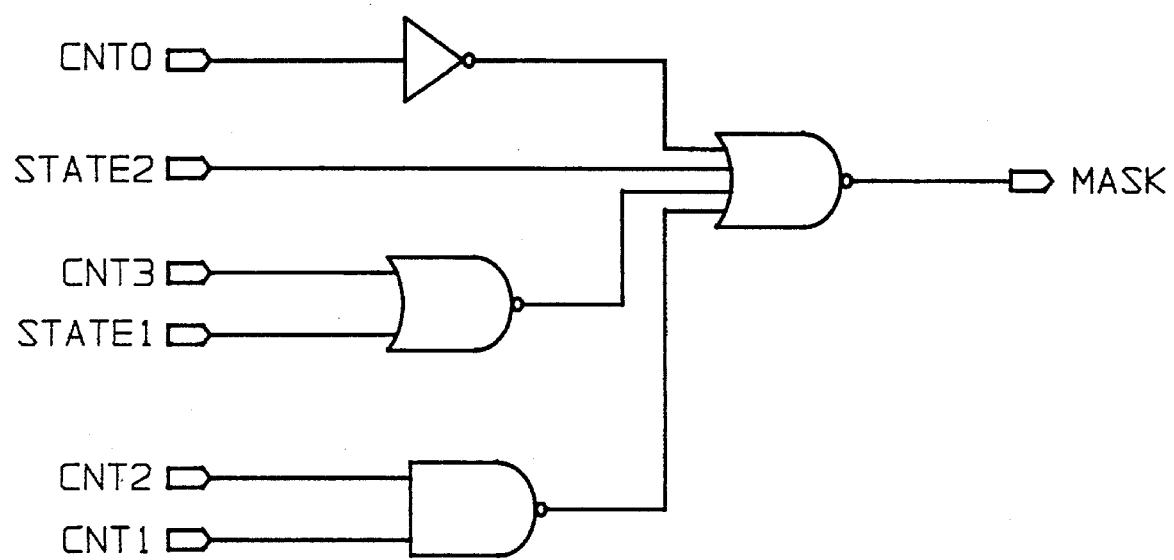
FIG. 7B is a partial circuit diagram of the logic associated with a state machine for use in the fault detection circuit of FIG. 1.
Figure 8:
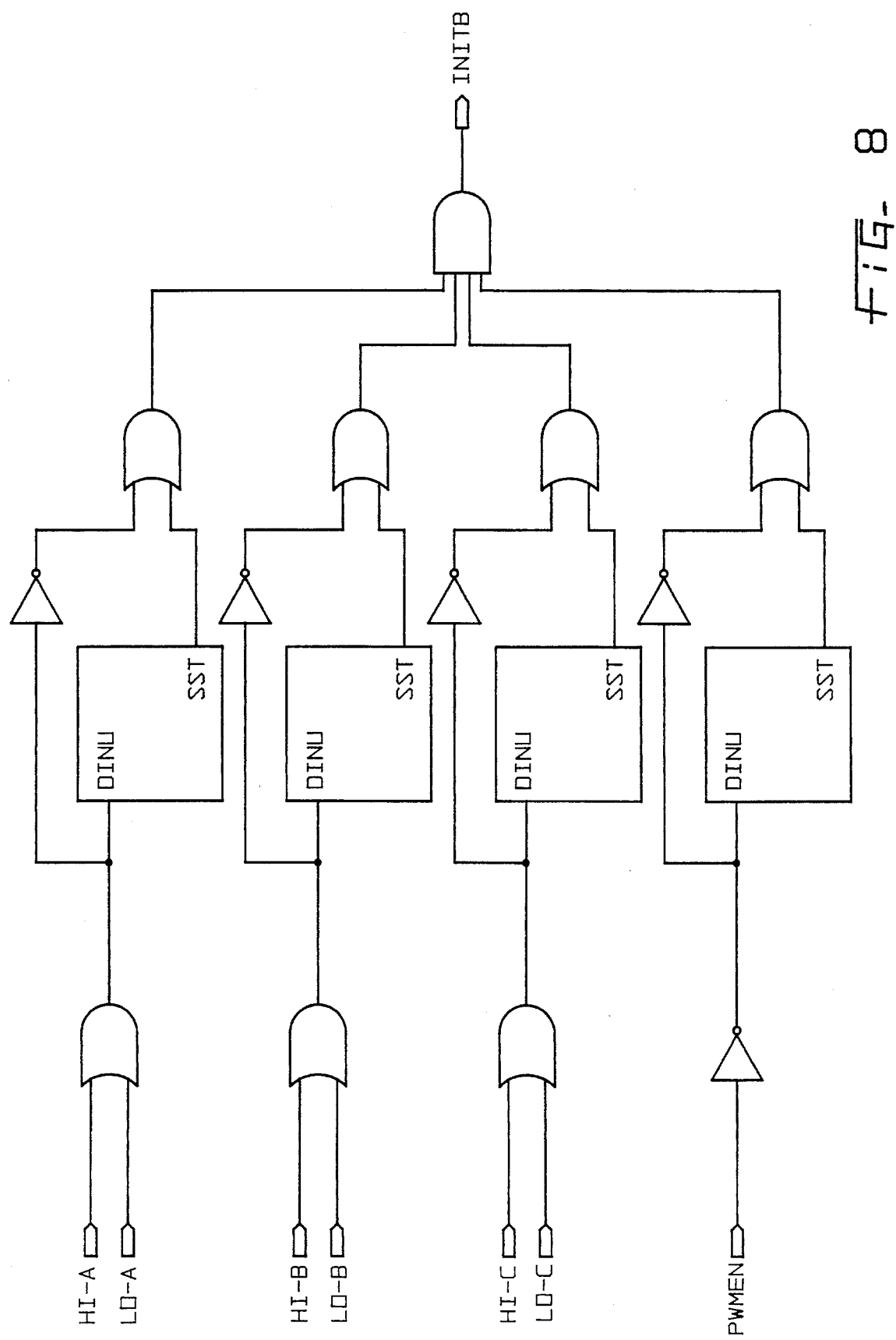
FIG. 8 is a circuit diagram of gate control logic for use in the fault detection circuit of FIG. 1.
Figure 9:
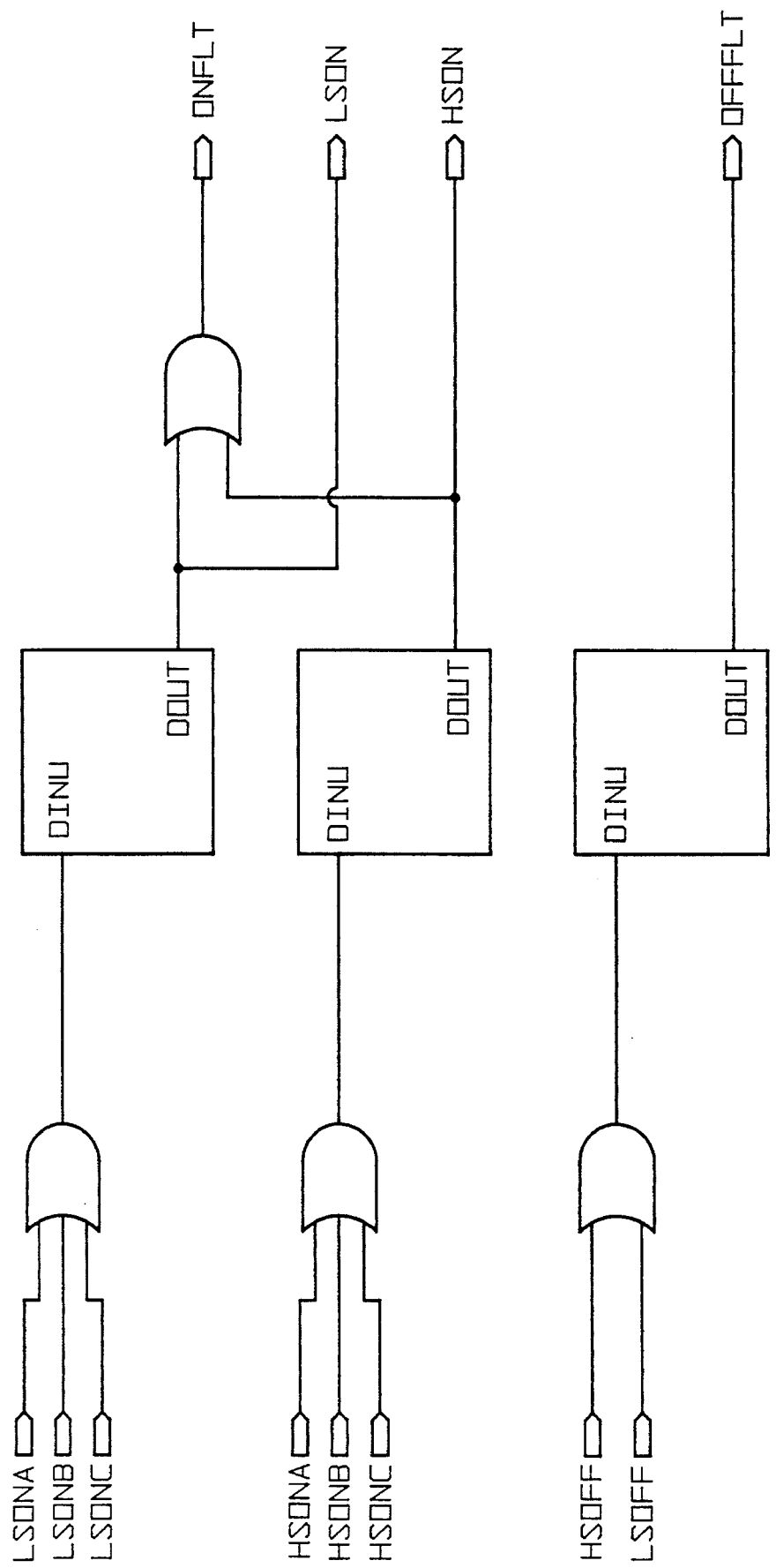
FIG. 9 is a circuit diagram of fault logic for use in the fault detection circuit of FIG. 1.
Figure 10:
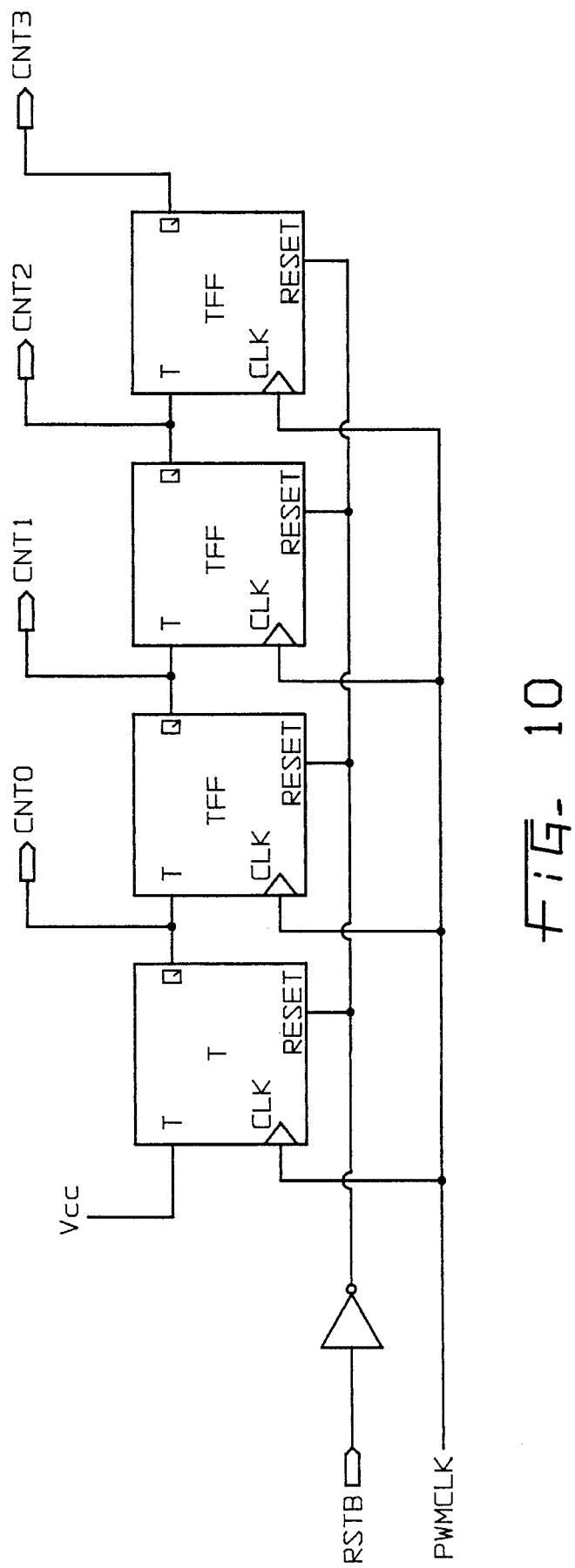
FIG. 10 is a circuit diagram of the timer for use in the fault detection circuit of FIG. 1.

FIG. 6 is a partial circuit diagram of fault detection circuit 20 illustrating a single sequence of the motor control circuit in the ON state and for driving motor 22. Referring to the Basic Switching Sequence Table, the illustration is of the transition from the forward phase sequence 1 0 0 to 1 0 1 in which phase winding A is driven to $V_{bat}$ and phase winding B is pulled to ground. During this sequence gate drive signal HI-A is active, thereby driving high side switching transistor 52 to its conducting state, resulting in connecting phase A to battery. At the same time gate drive signal LO-B is active, thereby driving low side switching transistor 58 to its conducting state, resulting in connecting phase B to ground. In this manner motor 22 is connected across the power supply through phase windings A and B so as to cause motor 22 to rotate in the forward direction. According to the Basic Switching Sequence Table, only the high side transistor of phase A and the low side transistor of phase B are activated. Accordingly, only the voltage drop across phase A with respect to $V_{refHI}$, and the voltage drop across phase B with respect to $V_{refLO}$ will be accepted as an out of range condition at fault logic block 34.

Should phase A be stuck to ground while being driven to $V_{bat}$, then a large voltage drop across the winding occurs. Comparator 66 compares the voltage drop across phase A with the reference voltage $V_{refHI}$ and, in the event an out of range condition exists, outputs a logic HI to one input of select logic AND gate 84. With phase A stuck to ground, $V_{vrefHI}$ will be greater than the voltage measured at node 117, thereby resulting in a logic HI output being produced by comparator 66. The other input of AND gate 84 receives gate drive signal HI-A which has been driven high to activate transistor 52. Therefore, if an out of range condition exists on phase A, then AND gate 84 will output a logic HI signal at output HSONA for input into fault logic block 34 and fault logic block 34 will output a logic LO at output LSON, a logic HI at output HSON, a logic HI at output ONFLT and a logic LO at output OFFFLT. These outputs are then input to state machine 36.

At the transition from basic switching sequence 1 0 0 to 1 0 1, gate control block 38 develops a fault detection initiating signal at output INIT and delivers the signal to input INIT of state machine 36. This places state machine 36 in default state 0. Timer block 48 is reset and begins counting 16 clock pulses of the prescaled clock signal as generated by programmable clock generator 42. Outputs CNT0–CNT3 are binary representations of the number of prescaled clock pulses and are sequentially incremented for each pulse counted. This counting sequence represents the initial mask time delay which is used to disregard transient faults associated with circuit operation. After reaching a count of 16, an internal "end of mask" time delay signal is generated in state machine 36. State machine 36 looks at the fault detection outputs of fault logic block 34 to determine if a fault condition exists after the initial mask time delay. If no such fault exists, then state machine 36 remains in state 0 and awaits a supplemental fault detection initiating signal from gate control block 38.

If a fault condition exists after the initial mask time delay, then state machine 36 transitions to state 1 and resets timer 48. Timer 48 counts an additional 8 clock pulses which represents a second fault mask time delay. At the end of 8 counts, state machine 36 generates an internal "end of mask" time delay signal and again looks to the fault detection outputs of fault logic block 34 to determine if a fault condition exists. If no fault condition exists, state machine 36 defaults to state 0 and awaits a supplemental fault detection initiating signal from gate control block 38. If a fault condition exists after this second fault mask time delay period has run, then state machine 36 transitions to state 2 and generates a valid fault output signal to fault register 50. The valid fault signal is generated at one or more of output lines FOFFG, FOFFB, FONG, and FONB depending upon the type of fault detected. Refer to the Fault Diagnostics Table included above which relates the fault output signal to the particular type of fault indicated.

Fault register 50 is connected to serial peripheral interface 46 for allowing communication of fault diagnostics information from fault register 52 to microprocessor 44. In addition, a fault signal (typically treated as an interrupt) is communicated to microprocessor 44 from fault register 50.

This signal also pulls gate drive signals HI-A and LO-B low, thereby deactivating transistors 52 and 58 while holding all other transistors low to prevent current damage to either motor 22 or transistors 24. After that, state machine 36 unconditionally transitions to state 3 wherein it will remain until being reset through the PWMEN input signal.

After the initial sequence and with the motor running in the desired manner, the mask time delay sequence of fault detection circuit 20 operates in a slightly different manner. For each subsequent switching sequence transition in which state machine 36 is initialized to default state 0, timer 48 counts 8 rather than 16 clock pulses for the initial fault mask time delay. The remainder of the fault detection sequence of operation functions as described above.

FIGS. 7A, 7B, 8, 9, and 10 are provided to illustrate typical logic circuits used for implementing the present fault detection circuit. Variations of these logic circuits may be used to implement the present fault detection circuit and it should be understood that such variations fall within the scope of the present invention.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. In an electronic motor control circuit for driving a brushed or brushless multi-phase electric motor having a plurality of phase windings, the motor control circuit comprising an electric power supply having supply and ground voltage terminals, a master clock signal, a serial peripheral interface for interfacing the motor driver circuit with a host microprocessor, a fault register, and a driver sequencing means for generating phase drive signals to sequentially drive the motor phase windings so as to cause the motor to move in a desired manner, a fault detection circuit comprising:

a programmable clock generator which receives the master clock signal and a set of digital program commands from the host microprocessor, said clock generator manipulating the master clock signal and producing a fault detection clock signal;

means for comparing the voltage drop across the motor phase windings with at least one reference voltage, whereby said comparing means produces at least one output indicating if the voltage drop across any of the motor phase windings falls outside of a predetermined normal operating range;

fault detecting means for receiving said comparing means output and the phase drive signals, said fault detecting means generating a fault indication signal upon the occurrence of a fault condition;

gate control means for receiving the phase drive signals and providing a fault detection initiating signal;

counting means for receiving said fault detection clock signal, said counting means counting the pulses of said fault detection clock signal and generating an output representing the number of clock pulses counted; and a logic state machine means for receiving said fault detection initiating signal, said counting means output, and said fault indication signal, said state machine means providing multi-state fault detection operation, whereby upon the occurrence of a fault condition said state machine means transitions from a first state to a subsequent state after at least one predetermined number of clock pulses have been counted, should the fault condition continue to exist with the state machine means in said subsequent state, said state machine means providing a valid fault signal to the fault register.

2. The motor control circuit of claim 1, wherein the frequency of said fault detection clock signal and said first number of clock pulses define a time delay period in the fault detection process, said time delay being selected according to the particular load characteristics associated with the selected motor, the host microprocessor digital commands defining said fault detection clock signal frequency and being downloaded to the motor driver circuit to set said time delay period.

3. The motor control circuit of claim 1, wherein said state machine means is initialized by said fault detection initiating signal to a first state, upon the occurrence of a fault condition after a predetermined first number of clock pulses said state machine means transitioning to a second state and resetting said counting means, upon the continued existence of the fault condition after a predetermined second number of clock pulses said state machine means transitioning to a third state and generating a valid fault signal which is input to the fault register, said state machine means then transitioning to a fourth state until being reset to said first state by the motor driver circuit.

4. The motor control circuit of claim 3, wherein the frequency of said fault detection clock signal and said first and second number of clock pulses define first and second time delay periods in the fault detection process, said first and second time delay periods being selected according to the particular load characteristics associated with the selected motor, the host microprocessor digital commands defining the frequency of said fault detection clock signal and being downloaded to the motor driver circuit to set said first and second time delay periods.

5. The motor control circuit of claim 1, wherein said fault condition comprises a group of fault conditions in which a first set of faults indicates a fault condition with the motor in an on mode, and a second set of faults indicates a fault condition with the motor in an off mode, said first and second sets of faults comprising the following types of faults: short to ground, short to battery, shorted load, and open load, said fault indication signal indicating the type of fault condition which exists and whether the motor is operating in the on or off mode.

6. In combination with an electronic control circuit for controlling a brushed or brushless multi-phase electric motor having a plurality of phase windings, the control circuit comprising an electric power supply having supply and ground voltage terminals, a master clock signal, a mode of operation signal and a transistor network having a pair of switching transistors for each phase of the motor, an electronic motor driver circuit comprising:

a serial peripheral interface for interfacing said motor driver circuit with a host microprocessor;

a programmable clock generator which receives the master clock signal and a set of digital program commands from the host microprocessor, whereby said clock generator manipulates the master clock signal according to the host microprocessor digital commands so as to produce a prescaled clock signal:

means for generating transistor gate drive signals to sequentially drive the gates of the switching transistors to a conducting state, whereby the phases of the motor are sequentially connected between the supply and ground voltage terminals so as to cause the motor to move in a desired manner; and a fault detection circuit comprising;

means for comparing the voltage drop across the motor phase windings with at least one reference voltage, said comparing means producing at least one output for indicating if any of the motor phase winding voltage drops falls outside of a predetermined operating range;

fault detecting means for receiving said comparing means output and said transistor gate drive signals, said fault detecting means generating a fault indication signal upon detecting the existence of a fault condition;

gate control means for receiving said transistor gate drive signals and the mode of operation signal, said gate control means generating a fault detection initiating signal;

counting means for receiving said prescaled clock signal, counting the pulses of said clock signal, and generating an output representing the number of clock pulses counted: and a logic state machine means for receiving said fault detection initiating signal, said counting means output, and said fault indication signal, said state machine means providing multiple-state fault detection operation, whereby said state machine means is initialized to a first state, upon the existence of a fault condition after a predetermined first number of clock pulses said state machine transitioning to a second state and resetting said counting means, upon the continued existence of the fault condition after a predetermined second number of clock pulses said state machine transitioning to a third state and generating fault condition output, said state machine means then transitioning to and remaining in a fourth state until being reset to said first state by the control circuit.

7. The motor control circuit of claim 6, wherein the frequency of said prescaled clock signal and said first and second number of clock pulses define first and second time delay periods, said first and second time delay periods being selected according to the particular load characteristics associated with the motor, the host microprocessor digital commands defining the frequency of said prescaled clock signal and being downloaded to the motor driver circuit to set said first and second time delay periods.

8. The motor control circuit of claim 6, wherein said fault condition comprises a group of fault conditions in which a first set of faults indicates a fault condition with the motor in an on mode, and a second set of faults indicates a fault condition with the motor in an off mode, said first and second sets of faults comprising the following types of faults: short to ground, short to battery, shorted load, and open load, said fault indication signal indicating the type of fault condition which exists and the mode in which the motor is operating.

9. A method of detecting fault conditions in a brushed or brushless, multi-phase electric motor having phase windings, and operatively connected with an electronic motor control circuit, the method comprising the steps of:

downloading instructions from an external source to the motor control circuit, which includes setting a predetermined time delay, the duration of the time delay determined according to the characteristics of the motor and selected to mask fault indications caused by transients;

generating a fault detection signal to initiate fault detection; and waiting until the predetermined time delay has elapsed after generating the fault detection signal and then measuring the voltage drops across the phase windings of the motor and comparing the measured phase voltage drops with at least one reference voltage to detect the existence of a fault condition.

10. The fault detection method of claim 9 wherein the motor control circuit generates a motor drive signal which transitions between a plurality of states to selectively supply power to the phase windings, and the step of generating a fault detection signal comprises generating a fault detection signal when the motor drive signal transitions to a new state.

11. The fault detection method of claim 9 further comprising the step of:

terminating or preventing motor operation upon detecting the existence of a fault condition.

12. The fault detection method of claim 9, further comprising the step of:

waiting until the predetermined time delay has elapsed after detecting a fault condition and then measuring the voltage drops across the phase windings of the motor for a second time and comparing the second measured phase voltage drops with at least one reference voltage to verify the existence of a fault condition.

13. The fault detection method of claim 12 further comprising the step of:

terminating or preventing motor operation upon verifying the existence of a fault condition from the second measurement of the voltage drops.

* * * * *